(12) United States Patent
Harres

(10) Patent No.: US 6,880,114 B2
(45) Date of Patent: Apr. 12, 2005

(54) BUILT-IN TEST SIGNAL ATTENUATION CIRCUIT

(75) Inventor: Daniel N. Harres, Belleville, IL (US)

(73) Assignee: The Boeing Company, Chicago, IL (US)

(*) Notice: Subject to any disclaimer, the term of this patent is extended or adjusted under 35 U.S.C. 154(b) by 444 days.

(21) Appl. No.: 10/061,517

(22) Filed: Jan. 31, 2002

(65) Prior Publication Data

US 2003/0145267 A1 Jul. 31, 2003

(51) Int. Cl.[7] ........................ H03M 13/00; G01R 31/28
(52) U.S. Cl. ........................ 714/709; 714/733
(58) Field of Search ............................... 714/733, 704, 714/703, 724, 744; 708/444; 375/141; 356/617

(56) References Cited

U.S. PATENT DOCUMENTS 4,808,939 A * 2/1989 Kingston ..................... 327/553

* cited by examiner

*Primary Examiner*—Albert Decady
*Assistant Examiner*—James C. Kerveros
(74) *Attorney, Agent, or Firm*—Shimokaji & Associates, P.C.

(57) ABSTRACT

A test signal attenuation circuit is built into a signal transmitter for modifying the energy content of the transmitter output signal. The built-in test signal attenuation circuit includes circuits for generating an attenuated, degraded, chopped signal. The built-in test signal attenuation circuit may be used for purposes of testing the performance of a link under degraded conditions.

12 Claims, 2 Drawing Sheets

BUILT-IN TEST SIGNAL ATTENUATION CIRCUIT

BACKGROUND OF THE INVENTION

This invention relates to a test signal attenuation circuit, and more particularly, to a circuit to reduce transmitted power which will verify that proper Bit Error Rate (BER) performance can be achieved with reduced power.

Such a test tells the operator that the link will perform properly even after being subjected to environmental factors that reduce the transmitter power, degrade receiver sensitivity, or attenuate the channel. An example of such a need is the pre-flight checkout of an aircraft data network, although the invention is useful with any network interface.

In many systems, a reduction in transmitter power is not possible or practical. For example, many commercially available off the shelf (COTS) electro-optic transmitters are logic-output based, with levels predetermined. Many gigabit data networks employ Emitter Coupled Logic or other logic with fixed voltage levels out. Such logic levels cannot easily be reduced for health monitoring purposes or to determine whether the system or circuit will operate at reduced voltage or power levels. Even where such power control is available, it is often a single, discrete level change, rather than a continuous adjustment. The circuit or system designer has no flexibility regarding the amount of attenuation that is to be introduced into the data link. In addition, the approach of opening connectors to the link so as to provide access to the link through a special test equipment may create contamination problems, particularly in case of fiber optic links and does not check the transmitter or receiver itself, or any section of the cable between the transmitter and receiver. Also, special test equipment is often not available in field operations.

This invention therefore relates to a built-in test signal test attenuation circuit to determine whether the system will operate satisfactorily. Since it is built into the transmitter circuitry, it is always available. Further, since it relies on pulse-width modulation of the data pulses to degrade the link, rather than signal amplitude attenuation, it works with any link.

SUMMARY OF THE INVENTION

In one aspect of the present invention, a test signal attenuation circuit comprises a signal transmitter; a circuit for generating a binary-level waveform; a circuit for providing a chopping signal for a square type waveform; a circuit for combining the binary-level waveform and the chopping signal to produce an attenuated chopped signal having less energy content than the original, generated binary-level waveform, and a circuit for feeding the attenuated chopped signal to the signal transmitter to test the energy of the output signal from the signal transmitter.

In another aspect of the present invention, a test signal attenuation circuit comprises a signal transmitter; a circuit for generating a binary-level waveform; a circuit for providing a chopping signal for a square type waveform; a chopping circuit for combining the binary-level waveform and the chopping signal to produce an attenuated chopped signal having less energy content than the original, generated binary-level waveform; and a circuit for feeding the attenuated chopped signal to the signal transmitter to test the energy of the output signal from the signal transmitter; with the chopping circuit providing an attenuated chopped signal having a narrower pulse width than the original binary-level waveform.

In yet a further aspect of the present invention, a test signal attenuation circuit comprises a signal transmitter; a circuit for generating a binary-level waveform; a circuit for providing a chopping signal for a square type waveform; a chopping circuit for combining the binary-level waveform and the chopping signal to produce an attenuated chopped signal having less energy content than the original, generated binary-level waveform; a circuit for feeding the attenuated chopped signal to the signal transmitter to test the energy of the output signal from the signal transmitter; and the chopping circuit providing an attenuated chopped signal having a narrower pulse width than the normal original square type waveform.

In a still further aspect of the present invention, a method of developing an electrical test signal comprising the steps of activating a signal transmitter; generating a binary-level waveform; providing a chopping signal for a square type wave form; combining the binary-level waveform and the chopping signal to produce an attenuated chopped signal having less energy content than the original, generated binary-level waveform.

These and other features, aspects and advantages of the present invention will become better understood with reference to the following drawings, description, and claims.

DETAILED DESCRIPTION OF THE INVENTION

Figure 1:
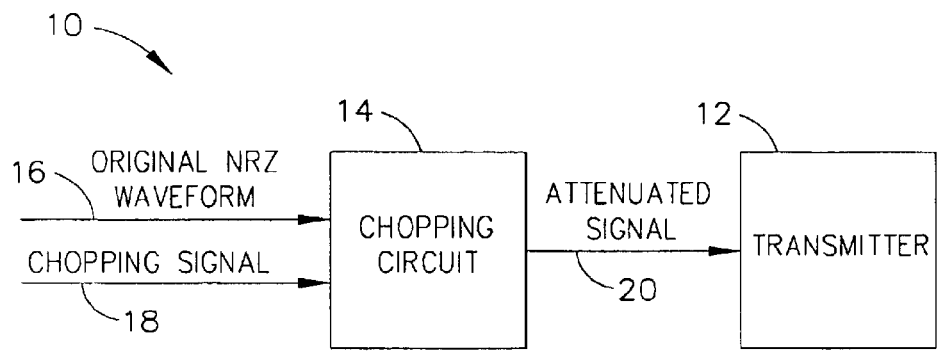
FIG. 1 is a schematic block diagram of the test signal attenuation circuit of the present invention inserted before a transmitter.

The following detailed description is the best currently contemplated modes for carrying out the invention. The description is not to be taken in a limiting sense, but is made merely for the purpose of illustrating the general principles of the invention.

In general, a test signal attenuation circuit is provided by the present invention which includes a signal transmitter, a circuit for generating a binary-level waveform (NRZ), a circuit for providing a chopping signal for a binary-level waveform, a chopping circuit for combining the binary-level waveform and the chopping signal to produce an attenuated chopping signal having less energy content than the original binary-level waveform. The chopping circuit provides an attenuated chopped signal having a narrower pulse width than the original binary-level waveform, but the same amplitude so as to operate on any link. A pulse shaping circuit driven by clock pulses forms the attenuated pulses in the chopped attenuated signal which are also combined with modulated clock pulses in the normal waveform.

In its most rudimentary form, the present invention therefore comprises an attenuating circuit that is inserted before a signal transmitter. The circuit has a chopping circuit for chopping a waveform that eliminates a fraction of any NRZ (non-returned to zero, normal square-type waveform) "1" bit at the beginning of the bit interval and a fraction of the "1" bit at the end of the bit interval to modulate the signal to reduce the energy in the signal. The signal can be degraded to the point where errors in the BER (Bit Error Rate) performance may begin to show, establishing that the signal upon degradation from outside environmental sources, such as extraneous noise, will or will not perform properly.

Referring now to the drawings in detail wherein like numerals indicate like elements throughout the several views, a circuit 10 of the present invention is an attenuating circuit that can be inserted before and can be part of the built-in circuitry of a signal transmitter 12.

The attenuating circuit may include a chopping circuit 14 that can use a chopping signal 18 that eliminates a fraction of any NRZ "1" bit signal 16 at the beginning of the bit interval and a fraction of the "1" bit at the end of the bit interval to provide a degraded, attenuated signal 20 to the transmitter 12.

Figure 2:
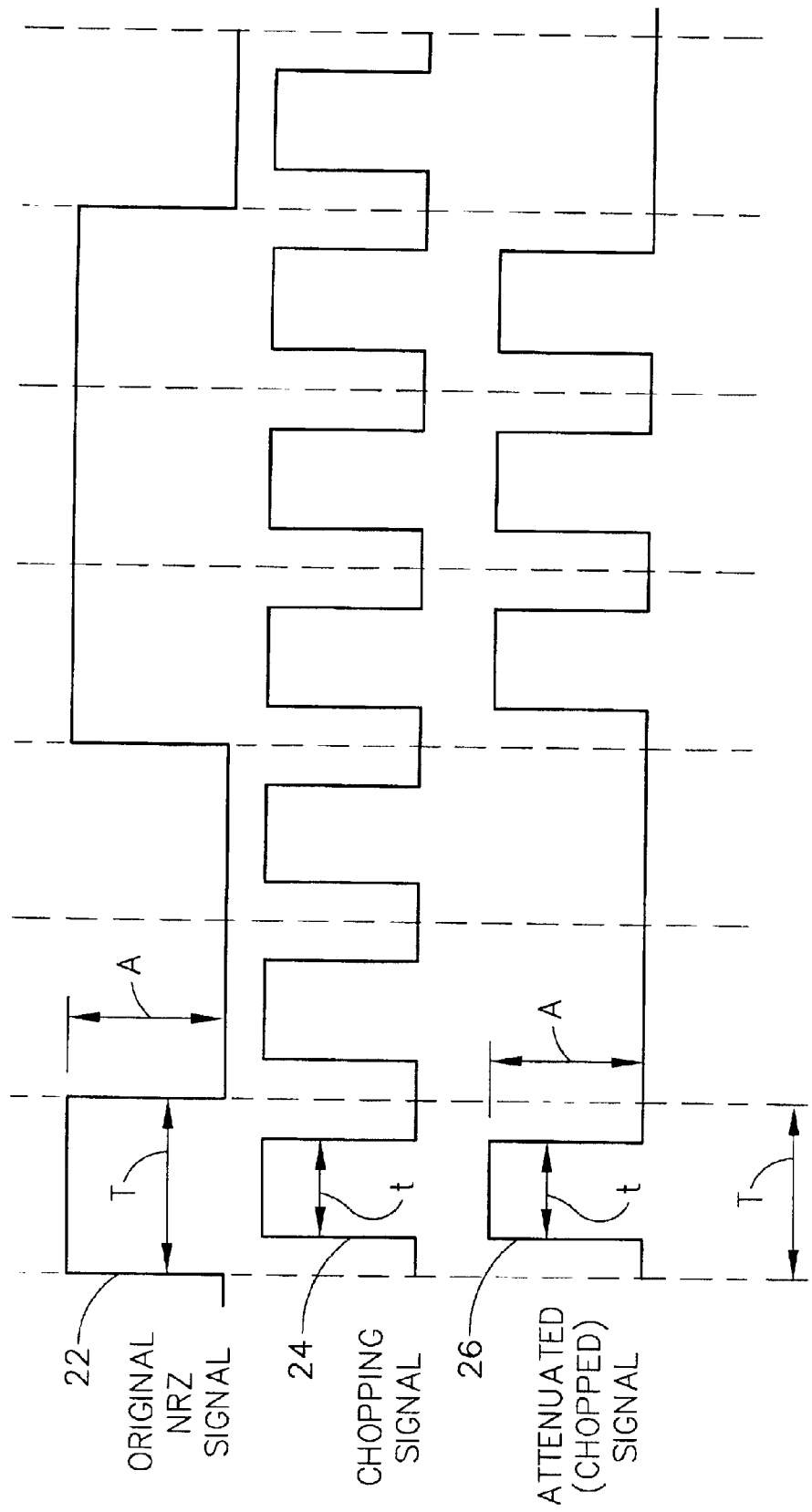
FIG. 2 is a schematic view comparing the attenuation circuit waveforms produced by the circuit of the present invention with the original NRZ signal waveform.

The waveforms illustrated in FIG. 2 are one example of such chopping, although, in general, any modulation of the signal can reduce the energy in the signal 20. Because the energy of the bit is smaller for the chopped signal, the signal-to-noise is lower and therefore its bit error rate (BER) will be higher.

As illustrated in FIG. 2, an original NRZ signal waveform 22 can be modulated or combined with a chopping signal 24 to produce an attenuated or chopped signal 26 which can be fed to the transmitter 12. The chopped signal 26 will have narrowed bit pulses t from T at the same amplitude A. Since the chopped test signal 26 relies on narrowed bit pulse widths to degrade the signal, rather than signal amplitude attenuation, it can work with any link to the transmitter 12.

Figure 3:
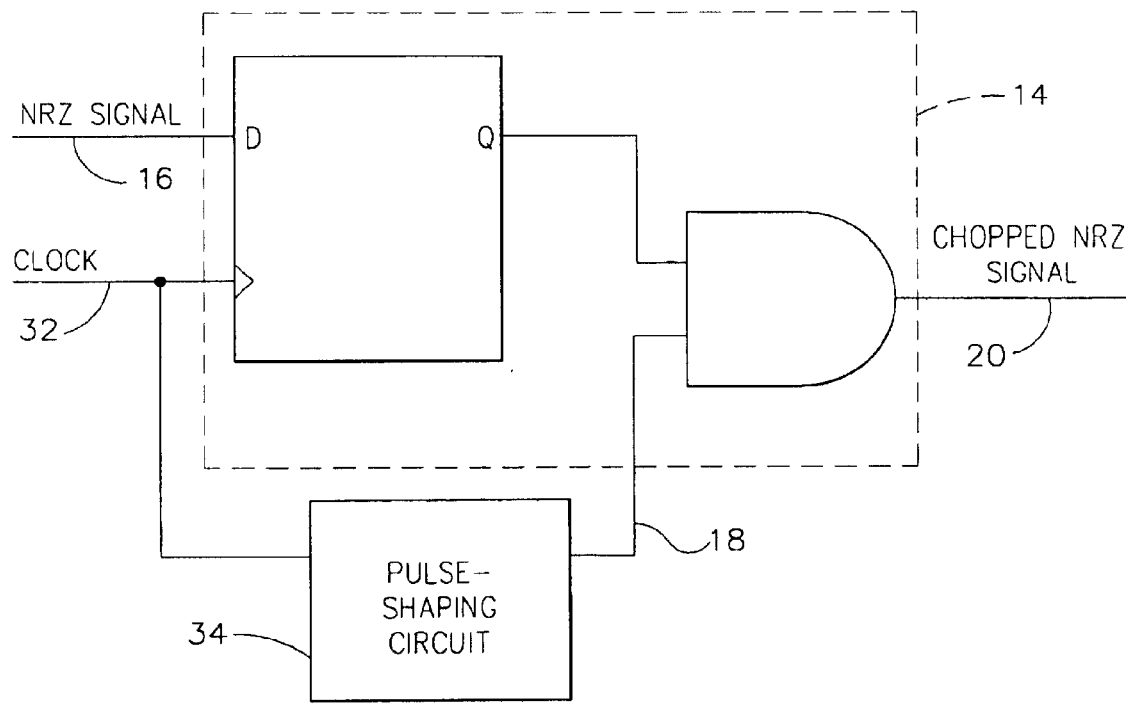
FIG. 3 is a schematic block diagram illustrating a typical implementation of the attenuation circuit of the present invention.

The implementation or use of the chopping circuit 10 is illustrated in FIG. 3. The NRZ signal may be converted to the waveform 22 illustrated in FIG. 2 and combined with a chopping signal having the waveform 24, as illustrated in FIG. 2, to produce a chopped NRZ signal 30 having a waveform illustrated in FIG. 2 at 26. This can be done using clock pulses provided by a clock pulse generator 32 sent through a pulse-shaping circuit 34 to provide the chopped signal waveform 24, which is combined with the original NRZ signal attenuated by the clock pulses to produce the waveform 22 which when combined result in the chopped attenuated NRZ signal 20 fed to the transmitter 12. The narrowing of the logic "1" pulses will change the DC level of the transmitted signal stream and, therefore, an AC-coupled receiver will have a quiescent operating level that is not halfway between the two states, the way it would be with the original NRZ signal. This can cause a somewhat asymmetric response for a threshold intended for a DC level exactly halfway between the two level states. As a result, the BER for logic "1's" will be somewhat worse than the BER for logic "0's". However, since a purpose of the chopped signal is merely to degrade the signal to the point where errors may begin to show, this asymmetry in the BER does not reduce the utility of the approach.

While the principles of the invention have been made clear in the illustrative embodiment, it will be obvious to those skilled in the art many modifications of structure, arrangement, materials and components used in the practice of the invention can be made, without departing from the principles of the invention. The appended claims are intended to cover and embrace any and all such modifications, with the limits only of the true purview, spirit and scope of the invention.

I claim:

1. A test signal attenuation circuit comprising:
a signal transmitter;
a pulse-shaping circuit for providing a chopping signal; and
a chopping circuit that combines an original binary-level waveform and said chopping signal to produce an attenuated chopped signal having less energy content than said original binary-level waveform, wherein:
said attenuated chopped signal is fed to said signal transmitter; and
said signal transmitter transmits said attenuated chopped signal at lower signal-to-noise ratio compared to transmission of said original binary-level waveform.

2. The attenuation circuit of claim 1 wherein said chopping circuit provides an attenuated chopped signal having a narrower pulse width than the original binary-level waveform.

3. The attenuation circuit of claim 2 wherein said chopping circuit provides an attenuated chopped signal having the same amplitude as the original binary-level waveform.

4. The attenuation circuit of claim 1 wherein said attenuated chopped signal produces a higher bit-error rate in a link to said signal transmitter than the original binary-level waveform.

5. The attenuation circuit of claim 1 wherein said pulse shaping circuit converts clock pulses into the chopping signal waveform that is delayed with respect to the bit intervals of an original binary level waveform.

6. A test signal attenuation circuit comprising:
a signal transmitter;
a pulse-shaping circuit for providing a chopping signal; and
a chopping circuit that combines an original binary-level waveform and said chopping signal to produce an attenuated chopped signal having less energy content than said original binary-level waveform, wherein:
said attenuated chopped signal has a narrower pulse width than the original binary-level waveform;
said attenuated chopped signal is fed to said signal transmitter; and
said signal transmitter transmits said attenuated chopped signal at lower signal-to-noise ratio compared to transmission of said original binary-level waveform.

7. The test signal attenuation circuit of claim 6 wherein said chopping circuit provides an attenuated chopped signal having the same amplitude as the original binary-level waveform.

8. The test signal attenuation circuit of claim 6 wherein said attenuated chopped signal produces a higher bit-error rate in a link including said signal transmitter.

9. The test signal attenuation circuit of claim 8 wherein said pulse shaping circuit converts clock pulses into the chopping signal waveform that is delayed with respect to the bit intervals of an original binary level waveform.

10. A test signal attenuation circuit comprising:
a signal transmitter;
a pulse-shaping circuit for providing a chopping signal from a clock signal;
a chopping circuit that combines an original binary-level waveform and said chopping signal to produce an attenuated chopped signal having less energy content than said original binary-level waveform; and wherein
said attenuated chopped signal has a narrower pulse width than the original binary-level waveform;
said attenuated chopped signal is fed to said signal transmitter; and
said signal transmitter transmits said attenuated chopped signal at lower signal-to-noise ratio with a higher bit error rate compared to transmission of said original binary-level waveform.

11. The test signal attenuation circuit of claim 10 wherein said chopping circuit provides an attenuated chopping signal having the same amplitude as the original binary-level waveform.

12. A method of developing an electrical test signal comprising the steps of:

generating a binary-level waveform;

providing a chopping signal;

combining said binary-level waveform and said chopping signal to produce an attenuated chopped signal having less energy content than the original binary-level waveform; and transmitting said attenuated chopped signal at a lower signal-to-noise ratio with a higher bit error rate than would occur by transmitting said binary-level waveform.

* * * * *